(12) United States Patent
Chen

(10) Patent No.: US 6,794,998 B2
(45) Date of Patent: Sep. 21, 2004

(54) DATA MODULATING/DEMODULATING METHOD AND SYSTEM AND APPARATUS USING THE SAME

(75) Inventor: Hong-Ching Chen, Fengshan (TW)

(73) Assignee: MediaTek Inc., Hsinchu (TW)

( * ) Notice: Subject to any disclaimer, the term of this patent is extended or adjusted under 35 U.S.C. 154(b) by 0 days.

(21) Appl. No.: 10/272,267

(22) Filed: Oct. 15, 2002

(65) Prior Publication Data

US 2004/0021589 A1 Feb. 5, 2004

(30) Foreign Application Priority Data

Jul. 30, 2002 (TW) ........................................ 91116951 A

(51) Int. Cl.$^7$ ............................................... H03M 7/00
(52) U.S. Cl. ........................................ 341/59; 341/106
(58) Field of Search ................................ 341/58, 59, 94, 341/106; 375/253, 343

(56) References Cited

U.S. PATENT DOCUMENTS

| 6,127,951 A | * | 10/2000 | Nakagawa et al. | ........... 341/59 |
| 6,144,324 A | * | 11/2000 | Sasaki | .................. 341/94 |
| 6,340,938 B1 | * | 1/2002 | Nakagawa | ............. 341/58 |
| 6,369,724 B1 | * | 4/2002 | Nakagawa | ............. 341/59 |
| 6,483,882 B1 | * | 11/2002 | O'Dea | ................... 375/343 |
| 6,496,541 B1 | * | 12/2002 | Kahlman et al. | .......... 375/253 |

\* cited by examiner

Primary Examiner—Patrick Wamsley
(74) Attorney, Agent, or Firm—J.C. Patents

(57) ABSTRACT

Data modulating/demodulating method and system and apparatus using the same. The modulation method with smaller modulation table, compared to the conventional modulation table, is used to modulate the source data to the channel bits to be recorded to an external storage apparatus, such as optical disc. The demodulation method with smaller demodulation table, compared to the conventional demodulation table, is used to demodulate the bit data stream recorded on a storage apparatus, such as optical disc, to the original source data.

26 Claims, 4 Drawing Sheets

DATA MODULATING/DEMODULATING METHOD AND SYSTEM AND APPARATUS USING THE SAME

CROSS-REFERENCE TO RELATED APPLICATION

This application claims the priority benefit of Taiwan application serial no. 91116951, filed Jul. 30, 2002.

BACKGROUND OF THE INVENTION

1. Field of the Invention

The invention relates in general to a data modulating/demodulating method and a system and an apparatus using the same, and more particular, to a data modulating/demodulating method and a system and an apparatus using the same, in which a lookup table with reduced bit number is used, such that the processing efficiency is greatly enhanced, and the implementation cost is significantly reduced.

2. Related Art of the Invention

In a hard disc or optical disc system, Inter-Symbol Interference (ISI) effect frequently occurs for accessing data recorded in the disc, due to bandwidth limitation of the recording channel. To reliably access data under the effect of ISI, the channel bit modulation is performed on the data to be recorded. Before being recorded to the disc, the data to be recorded is converted into channel bit data in a format having the property of run-length limit (RLL). Referring to FIG. 1, a data byte is converted into channel bits after channel bit modulation.

The conventional channel bit modulation process for processing run-length limit data format is shown in FIG. 2, such as the EFM modulation for CD (Compact Disc) application and EFM+ modulation for DVD (Digital Versatile Disc) application. A source data signal 22 with a length of M bits, called a data symbol, is received. After the conversion by the run-length limit modulation table, a channel bit signal 24 with a length of N bits, called a codeword, is output and recorded in the recording channel 25. An example of the recording channel 25 is the storage space of a optical disc. For the application of DVD, the EFM+ (Eight-to-Fourteen Modulation plus) modulation method is adapted, which converts one 8-bit source data into 16 channel bits To read the recorded data, it requires a channel-bit modulation to demodulate the recorded channel bits to the source data. As shown in FIG. 2, the data recorded in the recording channel 25 is read as the channel bit signal 26. Using the demodulation table 27, the channel bit signal 26 with a length of N bits, said a codeword, is converted into the data 28 with the length of M bits. The above modulation and demodulation conversion, such as EFM and EFM+, are normally achieved by looking up the conversion tables. Therefore, a modulation table with M bits(table entries) times N bits(data), and a demodulation table with N bits (table entries) times M bits(data) are required. The modulation table and the demodulation table thus occupy a relative large chip area and are costly.

SUMMARY OF THE INVENTION

The present invention provides a data modulating method to modulate a source data signal into a modulation signal. The source data signal is converted into a plurality of source conversion data with a first bit length. A data conversion step is performed to extend the source conversion data into a modulation signal assembled by a plurality of modulation data units with a second bit length. The first bit length is shorter than the second bit length, while the first bit length is determined according to data characteristic of the modulation data units.

The present invention provides a data modulation apparatus including a modulation unit and an extension unit. The modulation unit receives a source data signal and converts such source data signal into a plurality of source conversion data with a first bit length. The extension unit extends the source conversion data into a modulation signal composed of a plurality of modulation data units with a second bit length. The first bit length is shorter than the second bit length, while the first bit length is determined according to data characteristics of the modulation data units.

The present invention provides a data demodulation method to demodulate a modulation signal into a data signal. The signal to be demodulated is partitioned into a plurality of partitions with a first bit length. According to a data conversion step, the partitions are folded into a plurality of modulation conversion data with a second bit length. The first bit length is larger than the second bit length, and the second bit length is determined according to data characteristics of the partitions of the demodulation signal. According to a demodulation table, the modulation conversion data are converted into the data signal.

The present invention further comprises a data decoding apparatus including a folding apparatus and a decoding unit. The folding apparatus receives a decoding signal and partitions the decoding signal into a plurality of partitions with a first bit length. According to a data conversion step, all the partitions are folded into a plurality of demodulation conversion data with a second bit length to be output. The first bit length is larger than the second bit length, and the second bit length is determined according to characteristics of the partitions of the demodulation signal. The demodulation unit converts the demodulation data into a data signal using a demodulation conversion table.

BRIEF DESCRIPTION OF THE DRAWINGS

These, as well as other features of the present invention, will become more apparent upon reference to the drawings wherein.

DETAILED DESCRIPTION OF THE PREFERRED EMBODIMENT

Figure 1:
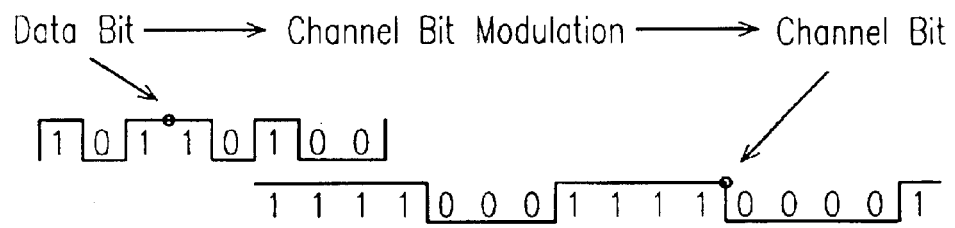
FIG. 1 shows the data format conversion process of conventional channel bit modulation and demodulation.

Embodiments of the present invention are illustrated in the accompanied drawings, in which the same or similar devices are denoted with the same reference numerals.

The present invention provides reading data from a storage medium, such as the bit data stream provided by an optical disc or an external storage apparatus. Through modulation process, such as channel bit modulation process, the data is modulated into data stream that is suitable for being recorded into a disc with the disc data format, such as the channel bits with the property of run-length limit (RLL). The bit data recorded in the disc, such as the channel bit data, is read and demodulated into the original source data.

The present invention provides a demodulation method to perform demodulation on the bit data to be demodulated using the demodulation conversion table conform to data characteristics of the storage format. Thereby, the demodulation conversion table with shorter bit length can be used to complete the demodulation. For example, the demodulated codeword, conform to the storage format, is partitioned into partitions with $\alpha$ bits. In the demodulation process, the partitions with $\alpha$ bits are converted into partitions with $\beta$ bits. The value of $\beta$ and the mapping relation between a partition with $\alpha$ bits and a partition with $\beta$ bits are determined according to the total possible combinations of a partition with $\alpha$ bits that fits the characteristics of channel modulation. This mapping relation is used to generate a new reduced demodulation table from the original demodulation table. Finally, the new partitions with $\beta$ bits are demodulated with the reduced demodulation table.

The present invention provides a modulation method to modulate the source data into the bit data to be recorded. The data to be modulated is then converted into a plurality of partitions with $\beta$ bits. Each partition with $\beta$ bits is extended into a new partition with $\alpha$ bits, and the new partitions with $\alpha$ bits are combined to form the modulation codeword. As the modulation method uses a data with shorter bit length ($\beta$ bits) to represent the original modulated data with longer bit length ($\alpha$ bits), the bit number of the modulation table is reduced with the ratio of ($\beta/\alpha$).

In the example of demodulation method for DVD, the EFM+ (Eight-to-Fourteen Modulation plus) modulation method is used, in which a modulation codeword is with the length of 16 bits and the minimum run length is 3T. In the following example, $\alpha$ is set to 3. If a 16-bit codeword is partitioned by $\alpha$ bits, 5 partitions are obtained with a residual of 1 bit, the residual bit is not translated and keeps the origin value. Each partition, said $[a_{i+1},a_i,a_{i-1}]$, has the property of minimum run length=3T, which results that the all possible combinations of $[a_{i+1},a_i,a_{i-1}]$ are {[0,0,0], [0,0,1], [0,1,0], [1,0,0]}. Since only four possible combinations for $[a_{i+1},a_i,a_{i-1}]$, $\beta$ has to be selected to make that each combinations for $[a_{i+1},a_i,a_{i-1}]$ can mapped to a unique partition of $\beta$ bit. That is, $2^\beta$ has to be larger than or equal to 4. For this reason, $\beta$ has to be at least 2 bits to cover all possible combinations for $[a_{i+1},a_i,a_{i-1}]$. In the example of taking $\beta$ equal to 2, the all combinations of $\beta$ bits $[b_i,b_{i-1}]$ include {[0,0], [0,1], [1,0], [1,1]} to represent all the possible combinations of $[a_{i+1},a_i,a_{i-1}]$, and the following is a example of mapping relation.

| $[a_{i+1},a_i,a_{i-1}]$ | → | $[b_i,b_{i-1}]$ |
|---|---|---|
| 0,0,0 | | 0,0 |
| 0,0,1 | | 0,1 |
| 0,1,0 | | 1,0 |
| 1,0,0 | | 1,1 |

If $\alpha$ is set to 4, a 16-bit codeword is partitioned to 4 partitions. Therefore, all possible combinations of $[a_{i+2},a_{i+1},a_i,a_{i-1}]$=[0,0,0,0], [0,0,0,1], [0,0,1,0], [0,1,0,0], [1,0,0,0], or [1,0,0,1], total 6 combinations. Therefore $\beta$ has to be selected to make that $2^\beta$ has to be larger than or equal to 6. In the example of taking $\beta$=3 ($2^3$=8), a mapping relation is shown as the follows:

| $[a_{i+2},a_{i+1},a_i,a_{i-1}]$ | → | $[b_{i+1},b_i,b_{i-1}]$ |
|---|---|---|
| 0,0,0,0 | | 0,0,0 |
| 0,0,0,1 | | 0,0,1 |
| 0,0,1,0 | | 0,1,0 |
| 0,1,0,0 | | 0,1,1 |
| 1,0,0,0 | | 1,0,0 |
| 1,0,0,1 | | 1,0,1 |

In the above 6 possibilities of $[b_{i+1},b_i,b_{i-1}]$ is only an exemplary combination. When $\alpha$ equals to 5, 9 possible data occur. The conversion determines the value of $\beta$ according to the partitions with the length of $\alpha$ bits. If the values of $\alpha$ and $\beta$ are determined, a mapping relation are built to convert the original modulation table 23 into the new reduced modulation table 33.

Figure 3:
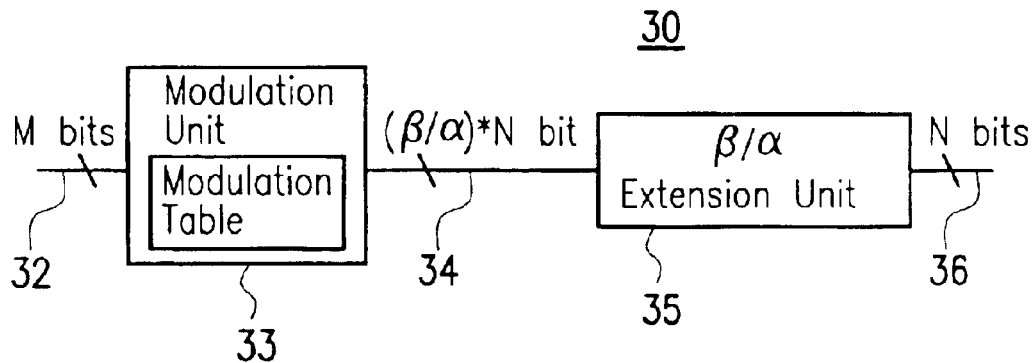
FIG. 3 shows a circuit block diagram of a modulation apparatus according to one embodiment of the present invention.

The above modulation method can be performed using a modulation apparatus of which the circuit block diagram is shown in FIG. 3. In this embodiment, the EFM+ modulation of DVD, that is, 16-bit modulation, is described as an example of the present invention. The modulation apparatus 30 receives a source data signal 32 with M bits, that is, 8 bits in the EFM+ modulation of DVD format. The source data signal 32 is then converted into a modulation signal 36 with N bits. The data conversion method includes performing modulation conversion on the source data signal 32 according to a conversion table with the characteristics of the modulation signal 36 conform to the storage format. For example, the modulation signal 36 conform to the storage format is partitioned into a plurality of partitions with $\alpha$ bits. For example, the modulation signal 36 is partitioned into 5 partitions with 3 bits and a residual 1 bit. The residual 1 bit keeps its original value and directly transferred to the modulation signal 36 as the conversion result. According to characteristic of the data format each of the partitions to be converted, such as the characteristic of run-length limit format, four possibilities corresponding to the bit length with $\alpha$=3 are derived. Accordingly, $\beta$=2 can be derived.

Figure 2:
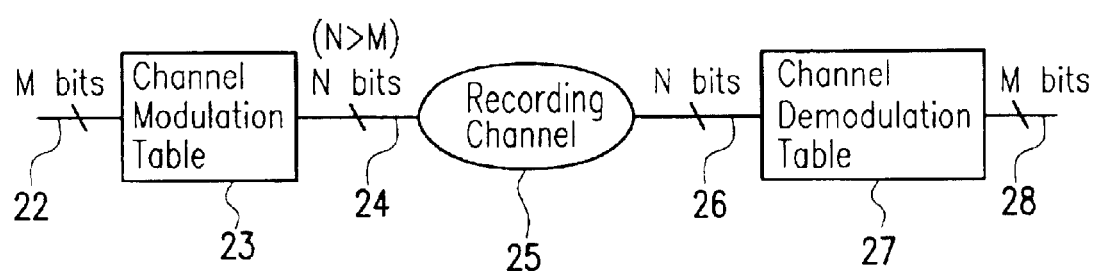
FIG. 2 shows the conventional channel bit modulation process.

For $\beta$=2, a modulation table is made in a modulation unit 33. The modulation unit 33 is to receive the source data signal 32, and to convert the source data signal 32 into a plurality of source conversion data 34 each with a length of $\beta$ bits. A $\beta/\alpha$ extension apparatus 35 is used to extend the source conversion data 34 into a plurality of partitions with a length of $\alpha$=3, which are combined to form a modulation codeword 36. In the example of 16 bits of the EFM+ format for DVD, the modulation signal 36 is converted as (3×5+1), in which 3 is the value of $\alpha$, 5 stands for the quantity of each partition, and 1 is the residual bit. As there are four possible data formats for $\alpha$=3, the bit length of $\beta$=2 is used to cover all the possible data formats for $\alpha$=3. Using $\beta$=2 to convert the above (3×5+1) into (2×5+1), where 2 is the value of $\beta$, and 5 is the quantity for each partition, the source conversion data 34 output from the modulation unit 33 includes data with 11 bits ($\beta/\alpha$)×15+1=11. All the partitions are converted by the $\beta/\alpha$ extension apparatus 35 into the modulation signal 36 with the bit length of (3×5+1)=16. For example, using the above mapping relation, each codeword in the modulation table 23 can be converted into a folded codeword and forms a new modulation table 33, shown as follows:

| DATA SYMBOL | Channel bits in the modulation table 23(FIG. 2) | Folded channel bits in the modulation table 33(FIG. 3) |
|---|---|---|
| 0000_0000 | 0_010_000_000_001_001 | 0_10_00_00_01_01 |
| 0000_0001 | 0_010_000_000_010_010 | 0_10_00_00_10_10 |
| 0000_0010 | 0_010_000_100_100_000 | 0_10_00_11_11_00 |
| 0000_0011 | 0_010_000_001_001_000 | 0_10_00_01_01_00 |
| 0000_0100 | 0_010_000_010_010_000 | 0_10_00_10_10_00 |
| 0000_0101 | 0_010_000_000_100_100 | 0_10_00_00_11_11 |
| 0000_0110 | 0_010_000_000_100_100 | 0_10_00_00_11_11 |
| 0000_0111 | 0_010_000_001_001_000 | 0_10_00_01_01_00 |
| 0000_0000 | . | . |
| | . | . |
| | . | . |

Figure 4:
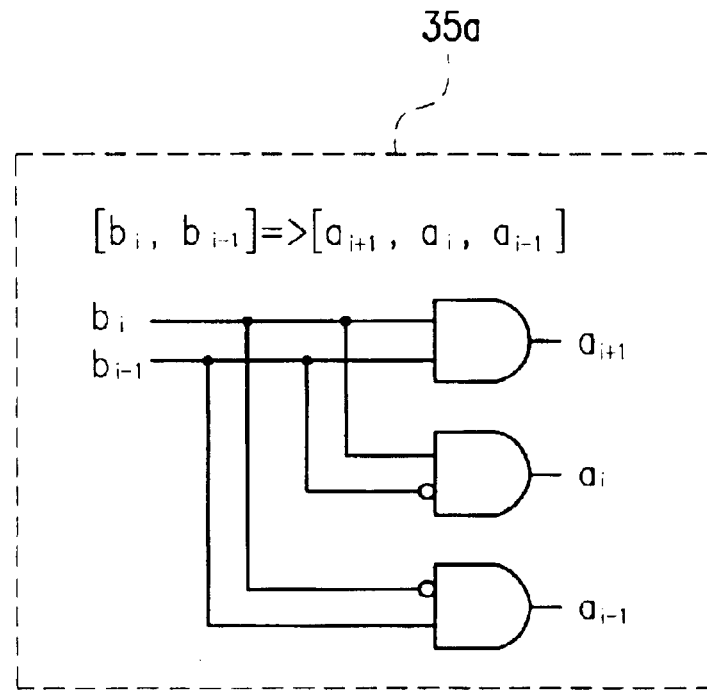
FIG. 4 shows a logic circuit of β/α extension apparatus in the circuit as shown in FIG. 3.

FIG. 4 shows the embodiment for converting data $[b_i, b_{i-1}]$ with the bit length of $\beta=2$ into the data $[a_{i+1}, a_i, a_{i-1}]$ with the bit length of $\alpha=3$. Three logic AND gates are used for the operation. For example, $b_i$ and $b_{i-1}$ are input to one of the AND gates for AND operation, such that modulation signal of $a_{i+1}$ is then output thereby. An AND operation is performed on the value of $b_i$ and the inverse value of $b_{i-1}$ of the modulation conversion data to obtain the modulation signal of $a_i$, and an AND operation is performed on the inverse value of $b_i$ and the value of $b_{i-1}$ to obtain the modulation signal of $a_{i-1}$.

In the above example for modulation, the new data modulation conversion table with shorter bit length ($\beta=2$) is used instead of using the conversion table with a longer bit length ($\alpha=3$), so that the operation efficiency is enhanced. As the required bit number of the conversion table is reduced, the required device and implementation cost thereof are consequently decreased. According to the above, the value of $\alpha$ is determined according to specific requirement. For example, $\alpha$ can be the length of four bits to result in 6 possible data formats according to the characteristics of the partitions. Consequently, $\beta$ has to be at least 3 to include all the possible data formats. In the example of the EFM+ format of DVD that has 16 bits, the modulation signal 36 is converted into (4×4) first, where the first 4 is the value of $\alpha$, and the second 4 is the quantity of the partitions. As there 6 possible data formats for $\alpha=4$, the bit length with $\beta=3$ can be used to cover all the possible data formats. The above (4×4) is converted into (3×4), where 3 is the value of $\beta$, and 4 is the quantity corresponding to the partition. The source conversion data output from the conversion table has the bit length of 12 bits, that is, $(\beta/\alpha)\times 16=12$. The partitions are then converted by the $\beta/\alpha$ extension apparatus 35 into the modulation signal 36 with (4×4)=16 bits of length.

The present invention further provides a demodulation method suitable for demodulating data recorded with storage format of the disc. Similar to the modulation method, the demodulation conversion is complete with a small conversion table, compared to a conventional one. For example, the codeword recorded in a disc is partitioned into a plurality of partitions each with length of $\alpha$ bits. According to characteristics of the above format, for example, the characteristic of run-length limit, each of the partitions is converted into a data with a length of $\beta$ bits, where $\beta<\alpha$. The converted partitions with 62 bits are used for the further demodulation, which requires a smaller lookup table and increase the process efficiency. As a result, the required devices are reduced, and the implementation cost is lowered. The selection of $\alpha$ and $\beta$ is determined according to specific design requirement and the selected value of $\alpha$.

In the above demodulation method, an error bit detection function is provided during converting a partition of $\alpha$ bits to a partition $\beta$ of bits. The conversion circuit detects if each partition with the length of $\alpha$ bits conforms to the valid data format, such as the run-length limit. If there is a partition that doesn't conform to the valid data format, an error signal is generated to indicate the demodulation data is wrong and the correct value is unknown, which is called an erasure. The table lookup operation also generates another error signal if the partitions of $\beta$ bits, which are the table entries, are not mapped to a valid modulation codeword. In the present invention, the error signal generated by the $\alpha$-to-$\beta$ conversion and the error signal generated by the table lookup operation are combined to a final error bit to indicate the demodulation result is wrong and the correct value is unknown.

Figure 5:
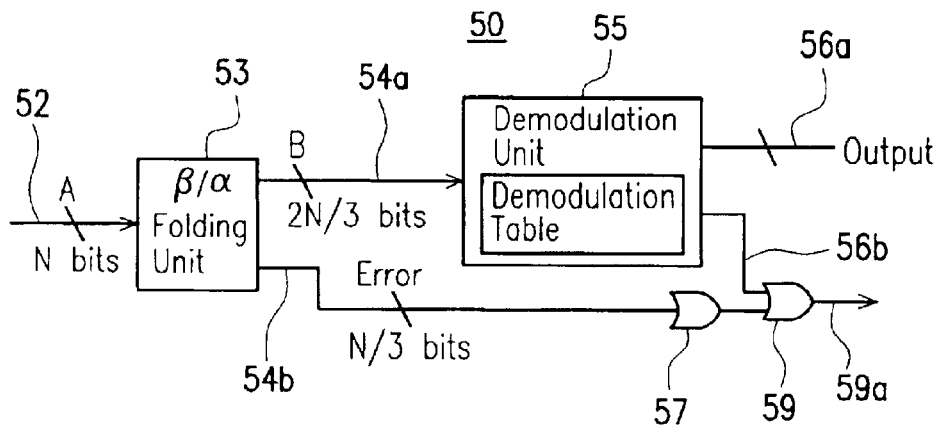
FIG. 5 shows the circuit block diagram of an embodiment of a demodulation apparatus.

FIG. 5 shows a data demodulation apparatus 50 which includes an $\alpha/\beta$ folding apparatus 53 and a demodulation unit 55. The $\alpha/\beta$ folding apparatus 53 receives an N-bit modulation signal 52 and partitions the N-bit modulation signal 52 into a plurality of $\alpha$-bit partitions. By the $\alpha/\beta$ folding step, all the partitions are folded into a plurality of $\beta$-bit partitions 54a. In this example, the modulation conversion data 54a have a length of 2N/3 bits, where N is a bit length of a modulation codeword. The $\beta$-bit length is determined according to the data characteristic of the $\alpha$-bit partitions of the modulation signal 52. For the convenience of description, N is assumed that it can be divisible by $\alpha$. If N cannot be divisible by $\alpha$, the remainder bit is not converted and is directly output.

In the EFM+ modulation for DVD application, the codeword length is 16 bits, and the minimum run length is 3T. Take an example of $\alpha$ equal to 3, the 16-bit codeword is partitioned by $\alpha$, five partitions and 1-bit residual are obtained. The 1-bit residual is not to be converted. Each of the five partitions has four possible combinations, that is, $[a_{i+1}, a_i, a_{i-1}] \subset \{[0,0,0], [0,0,1], [0,1,0], [1,0,0]\}$. Therefore, if a $\beta$-bit data is used to cover all the four possible combinations of $[a_{i+1}, a_i, a_{i-1}]$, $2^\beta$ has to be larger than or equal to 4. The determination of $\beta$ is similar to that of the demodulation apparatus. Similarly, if $\alpha$ is 4, the 6 data formats may possibly occur. The required value of $\beta$ is no less than 3. If the value of $\alpha$ is 5, 9 possible formats exist, so that the value of $\beta$ cannot be less than 4. After the value of $\beta$ is determined, the demodulation unit 55 outputs the data signal 56a of the data demodulation apparatus 50 converted according to a demodulation table. If the values of $\alpha$ and $\beta$ are determined, a mapping relation are built to convert the original demodulation table 27 into the new reduced demodulation table 55, an example of EFM+ demodulation are as follows:

| Signal 26(FIG. 2) | Signal 28(FIG. 2) | Signal 34(FIG. 3) | Signal 36(FIG. 3) |
|---|---|---|---|
| 0_010_000_000_001_001 | 0000_0000 | 0_10_00_00_01_01 | 0000_0000 |
| 0_010_000_000_010_010 | 0000_0001 | 0_10_00_00_10_10 | 0000_0001 |
| 0_010_000_100_100_000 | 0000_0010 | 0_10_00_11_11_00 | 0000_0010 |

-continued

| Signal 26(FIG. 2) | Signal 28(FIG. 2) | Signal 34(FIG. 3) | Signal 36(FIG. 3) |
|---|---|---|---|
| 0_010_000_001_001_000 | 0000_0011 | 0_10_00_01_01_00 | 0000_0011 |
| 0_010_000_010_010_000 | 0000_0100 | 0_10_00_10_10_00 | 0000_0100 |
| 0_010_000_000_100_100 | 0000_0101 | 0_10_00_00_11_11 | 0000_0101 |
| 0_010_000_000_100_100 | 0000_0110 | 0_10_00_00_11_11 | 0000_0110 |
| . | . | . | . |
| . | . | . | . |
| . | . | . | . |

When the above data demodulation apparatus is folding the partitions into the α/β conversion data 54a, if a partition doesn't conform to the data characteristic, such as the run length limit, an error bit is converted from logic "0" to logic "1" to indicate that the modulation signal 52 is wrong. Each partition generates its error bit, the error bits of all partitions are OR-gated to generate a total error bit. For example, the N/3-bit error signal 54b is output via a logic "OR" gate 57.

In the above data demodulation apparatus 50, when the demodulation unit 55 converts the α/β conversion data 54a into the data signal 56a, if the α/β conversion data 54a doesn't map to a valid demodulation result, an error signal 56b is generated to indicate the data signal 56a is an error. Such error detection mechanism is useful for the further error correction, such as the RSPC correction for DVD application. The error signal 56b related to the demodulation unit 55 and the output of "OR" gate 57 are operated by a logic "OR" gate 59 to provide a overall error bit 59a, which indicates the demodulation data 56a corresponding to the modulation signal 52 is an error.

Figure 6:
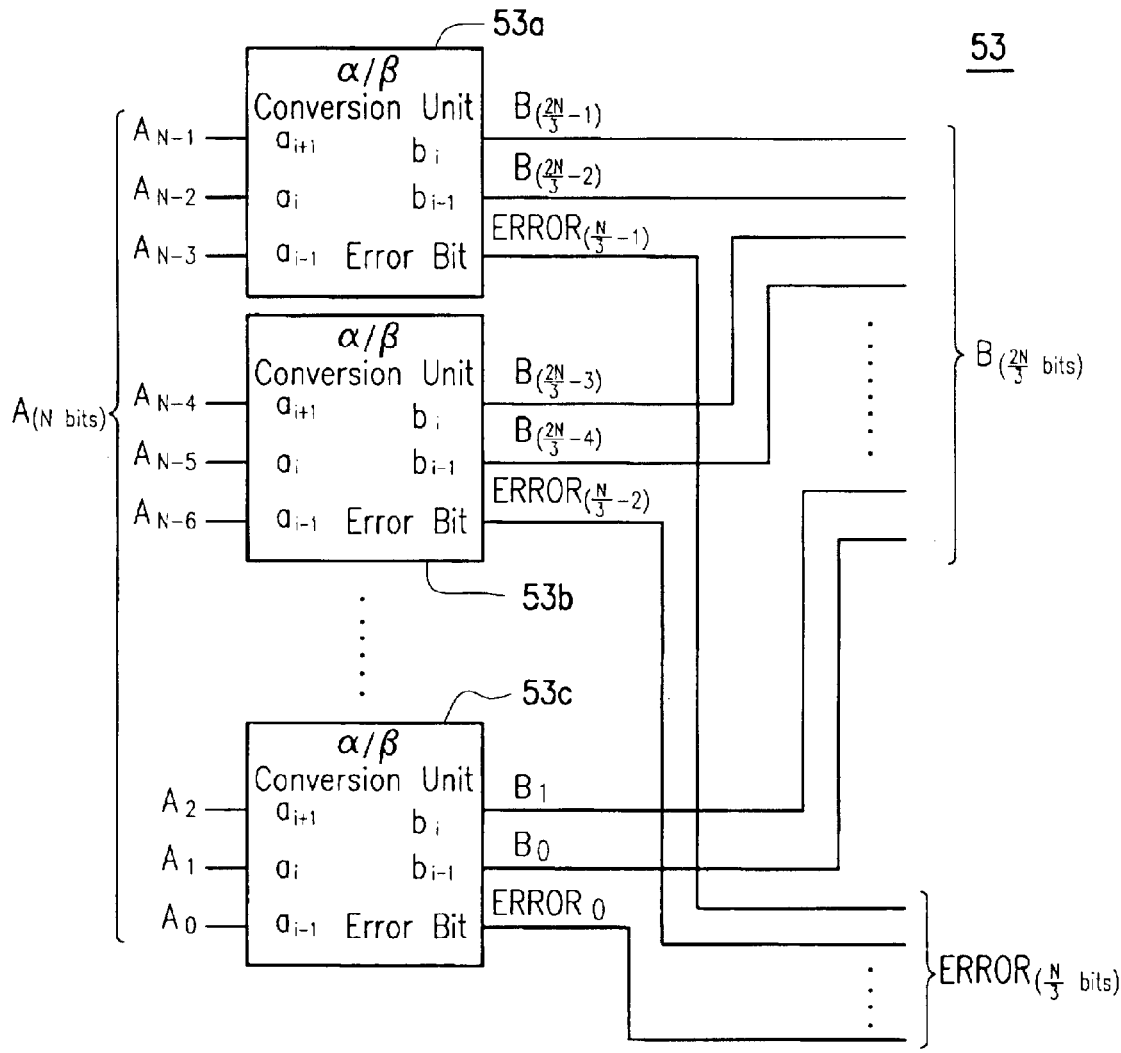
FIG. 6 shows an α/β folding apparatus in the circuit as shown in FIG. 5.

FIG. 6 shows an embodiment of the α/β folding apparatus 53 as shown in FIG. 5. In this embodiment, the value of α is 3, so that there are four possible data formats. Consequently, the value of β is 2. It is appreciated that the values of α and β are not limited to 3 and 2. The α/β folding apparatus 53 comprises a plurality of α/β folding units such as 53a, 53b and 53c. The N-bit modulation signal 52 (for the convenience of description, the modulation signal 52 is denoted as A, while $A_i$ is the i-th bit of the modulation signal 52) is partitioned into a plurality of partitions of α bits. The α/β conversion data 54a have 2N/3 bits. Hereinafter, B represents the 2N/3-bit modulation conversion data 54a, and $B_i$ is the i-th bit of the modulation conversion data 54a.

The α/β folding unit 53a, the $A_{N-1}, A_{N-2}, A_{N-3}$ bits of the N-bit modulation signal 52 are received from the $a_{i+1}$, $a_i$ and $a_{i-1}$ ports. According to the folding method of the α/β folding unit 53a, $[a_{i+1},a_i,a_{i-1}]$=[0,0,0], [0,0,1], [0,1,0], [1,0,0] corresponding to $[b_i,b_{i-1}]$=[0,0], [0,1], [1,0], [1,1] are output from $b_i$ and $b_{i-1}$ ports. Therefore, $[A_{N-1},A_{N-2},A_{N-3}]$ can be converted into $[B_{2N/3-1},B_{2N/3-2}]$. If $[A_{N-1}, A_{N-2}, A_{N-3}]$ does not exist in the above four cases, {[0,0,0], [0,0,1], [0,1,0], [1,0,0]}, the the error bit $ERROR_{N/3-1}$ is changed from logic "0" to logic "1".

The output bits $B_{2N/3-1}$, $B_{2N/3-2}$, $B_{2N/3-3}$, $B_{2N/3-4}$, ..., $B_1$, $B_0$ output from all the α/β folding units 53a, 53b, 53c of the α/β folding apparatus 53 are the 2N/3-bit α/β conversion data 54a. All the error bits, such as $ERROR_{N/3-1}$, $ERROR_{N/3-2}$, ..., $ERROR_0$, are denoted as the error signal 56b.

Figure 7:
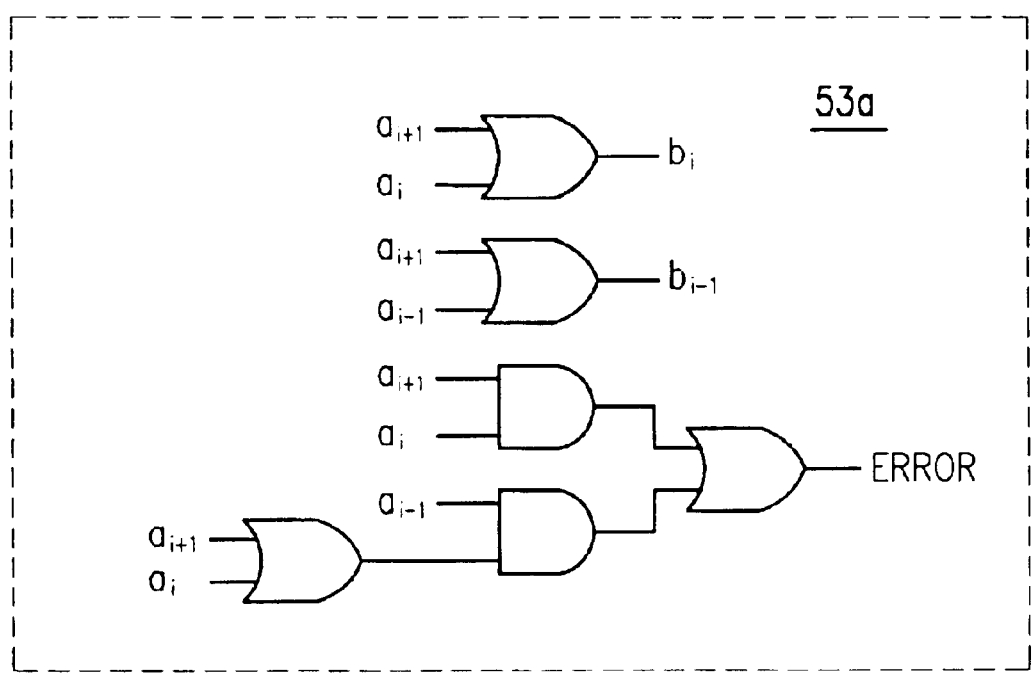
FIG. 7 shows a logic circuit diagram of the α/β folding apparatus as shown in FIG. 6.

In FIG. 7, an embodiment of the α/β folding unit 53a as shown in FIG. 6 is illustrated. The $A_{N-1}$-, $A_{N-2}$-, $A_{N-3}$-bit of the modulation signal 52 are connected to the $a_{i+1}$, $a_i$, $a_{i-1}$, ports of the α/β folding unit 53a. Through several logic gates, the bits $[A_{N-1},A_{N-2},A_{N-3}]$ are converted into $[B_{2N/3-1},B_{2N/3-2}]$. In FIG. 7, $a_{i+1}$, $a_i$ and $a_{i-1}$, represents the bits input to the $a_{i+1}$, $a_i$ and $a_{i-1}$, ports, while $b_i$ and $b_{i-1}$ indicate the logic values output to the $b_i$ and $b_{i-1}$ ports.

In the α/β folding unit 53a, the logic gates include a logic "OR" gate to receive the values of $a_{i+1}$ and $a_i$ and output $b_i$ bit value after logic "OR" operation, and a logic "OR" gate to receive the values of $a_{i+1}$ and $a_{i-1}$, and output $b_{i-1}$ bit value after logic "OR" operation. For the output error bit such as $ERROR_{N/3-1}$, a logic "OR" gate is used to receive the values of $a_{i+1}$ and $a_i$. After logic "OR" operation, and output value and the value of $a_{i-1}$ are operated and output by a logic "AND" operation of a logic "AND" gate. A logic "AND" operation is then performed on the output value and the value and the values of $a_{i+1}$ and $a_i$ by a logic "AND" gate. The error bit $ERROR_{N/3-1}$ is then output via a logic "OR" gate.

The data processing system of the present invention includes either the modulation apparatus 30 as shown in FIG. 3 or the data demodulation apparatus 50 as shown in FIG. 5. The data processing system is applicable for processing modulation and demodulation of a source data signal and a modulation signal. The optical data storage system includes an optical recording apparatus and a data modulation/demodulation apparatus. The modulation/demodulation apparatus performs modulation and demodulation between a source data signal and a modulation signal as the modulation apparatus 30 as shown in FIG. 3 and the demodulation apparatus 50 as shown in FIG. 5.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A data modulation method used to modulate a source data bite into a modulation codeword, in which the relation between the source data byte and the modulation codeword is defined by a modulation table, the data modulation method comprising:

converting the source data byte into a plurality of source conversion data having a first bit length according to a reduced modulation table; and according to a data conversion step, extending the source conversion data into the modulation signal composed by a plurality of modulation data units each having a second bit length, wherein the second bit length is shorter than the first bit length, and the first bit length is determined according to data characteristic of the modulation data units.

2. The modulation method according to claim 1, wherein the first bit length is determined according to all possible data combinations of the modulation data units, and 2 to the power of the first bit length is larger than or equal to the number of all the possible data combinations of the modulation data units with the second bit length.

3. The modulation method according to claim 2, wherein the number of the possible data combinations of the modulation data units is determined according to a data protocol used by the data modulation method.

4. The modulation method according to claim 3, wherein the data protocol includes a run-length limit protocol.

5. The modulation method according to claim 1, wherein the modulation table is a eight-to-fourteen modulation (EFM)/eight-to-fourteen modulation plus (EFM+) modulation table.

6. A data modulation apparatus, comprising:
   a modulation unit, having a reduced modulation table, operative to receive and convert a data source byte into a plurality of source conversion data each with a first bit length; and
   an extension unit, operative to convert the source conversion data into a modulation codeword, in which the relation between the source data byte and the modulation codeword is defined by a modulation table, comprising a plurality of modulation data units each with a second bit length, wherein the first bit length is shorter than the second bit length, and the first bit length is determined according to data characteristic of the modulation data units.

7. The modulation apparatus according to claim 6, wherein the first bit length is determined according to all possible data combinations of the modulation data units, and 2 to the power of the first bit length is larger than or equal to the number of all the possible data combinations of the modulation data units with the second bit length.

8. The modulation apparatus according to claim 7, wherein the number of the possible data combinations of the modulation data units is determined according to a data protocol used by the data modulation method.

9. The modulation apparatus according to claim 8, wherein the data protocol includes a run-length limit protocol.

10. A data modulation/demodulation apparatus, used for modulating and demodulating between a source data signal and a modulation signal, including the data modulation apparatus according to claim 6.

11. The modulation apparatus according to claim 6, wherein the modulation table is a eight-to-fourteen modulation (EFM)/eight-to-fourteen modulation plus (EFM+) modulation table.

12. A data demodulation method used to demodulate a modulation codeword into a data byte, in which the relation between the modulation codeword and the data byte is defined by a demodulation table, the demodulation method comprising:
   partitioning the modulation codeword into a plurality of partitions each having a first bit length;
   according to a data conversion step, folding the partitions into a plurality of modulation conversion data each having a second bit length, wherein the first bit length is longer than the second bit length, and the second bit length is determined according to data characteristics of the partitions of the modulation codeword; and
   according to a reduced demodulation table, converting the modulation conversion data into the data byte.

13. The demodulating method according to claim 12, wherein the second bit length is determined according to all possible data combinations of the partitions, and 2 to the power of the second bit length is larger than or equal to the correct number of the possible data combinations of the partitions.

14. The demodulating method according to claim 13, wherein the correct number of the possible data combinations of the partitions is determined according to a data protocol used by the data demodulation method.

15. The demodulation method according to claim 14, wherein the data protocol includes a run-length limit protocol.

16. The demodulation method according to claim 12, wherein in the data conversion step and when the partitions with the first bit length are folded into the modulation conversion data, an error signal is generated to indicate a modulation data error when at least one of the partitions does not conform to the data characteristic.

17. The demodulation method according to claim 12, wherein the step of converting the modulation conversion data into the data byte according to the reduced demodulation table, an error signal is generated to indicate a modulation data error when corresponding data cannot be found in the demodulation table.

18. The data demodulation method according to claim 12, wherein the demodulation table is a eight-to-fourteen modulation (EFM)/eight-to-fourteen modulation plus (EFM+) demodulation table.

19. A demodulation apparatus, used to demodulate a modulation codeword into a data byte, in which the relation between the modulation codeword and the data byte is defined by a demodulation table, the demodulation apparatus comprising:
   a folding apparatus, operative to receive and partition the modulation codeword a into a plurality of partitions each with a first bit length, and folding the partitions into a plurality of modulation conversion data each with a second bit length to be output, wherein the first bit length is longer than the second bit length, and the second bit length is determined according to data characteristic of the partitions of the modulation codeword; and
   a demodulation unit, having a reduced demodulation table to convert the demodulation conversion data into the data byte according to the reduced demodulation table.

20. The demodulation apparatus according to claim 19, wherein the second bit length is determined according to all possible data combinations of the partitions, and 2 to the power of the second bit length is larger than or equal to the number of all the possible data combinations.

21. The demodulation apparatus according to claim 20, wherein the number of the possible data combinations of the partitions is determined according to a data protocol used by the data demodulation method.

22. The demodulation apparatus according to claim 21, wherein the data protocol includes a run-length limit protocol.

23. The demodulation apparatus according to claim 19, wherein in the data conversion step for folding the partitions with the first bit length into the modulation conversion data, an error signal is generated by the folding apparatus to indicate a modulation data error when at least one of the partitions is not conform to the data characteristic.

24. The demodulation apparatus according to claim 19, wherein in the step the demodulation unit is converting the modulation conversion data into the data byte, an error signal is generated to indicate a modulation data error when corresponding data cannot be found in the demodulation table.

25. A data modulation/demodulation apparatus, used to modulating and demodulating between a source data byte and a modulation codeword, including the data demodulation apparatus according to claim 19.

26. The demodulation apparatus according to the claim 19, wherein demodulation table is a eight-to-fourteen modulation (EFM)/eight-to-fourteen modulation plus (EFM+) demodulation table.

* * * * *